United States Patent
Brandl et al.

(10) Patent No.: US 9,318,357 B2
(45) Date of Patent: Apr. 19, 2016

(54) METHOD FOR PRODUCING A MULTIPLICITY OF OPTOELECTRONIC SEMICONDUCTOR COMPONENTS

(71) Applicant: OSRAM Opto Semiconductor GmbH, Regensburg (DE)

(72) Inventors: Martin Brandl, Kelheim (DE); Markus Boss, Regensburg (DE); Markus Pindl, Tegernheim (DE); Simon Jerebic, Tegernheim (DE); Herbert Brunner, Sinzing (DE); Tobias Gebuhr, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/436,578

(22) PCT Filed: Oct. 14, 2013

(86) PCT No.: PCT/EP2013/071428
§ 371 (c)(1),
(2) Date: Apr. 17, 2015

(87) PCT Pub. No.: WO2014/060355
PCT Pub. Date: Apr. 24, 2014

(65) Prior Publication Data
US 2015/0255313 A1    Sep. 10, 2015

(30) Foreign Application Priority Data

Oct. 17, 2012   (DE) .......................... 10 2012 109 905

(51) Int. Cl.
*H01L 21/00*        (2006.01)
*H01L 21/56*        (2006.01)
(Continued)

(52) U.S. Cl.
CPC ............ *H01L 21/563* (2013.01); *H01L 21/568* (2013.01); *H01L 21/78* (2013.01);
(Continued)

(58) Field of Classification Search
CPC .................. H01L 2924/12041; H01L 224/97; H01L 2924/12043; H01L 24/87; H01L 25/0753; H01L 25/167
USPC .............................. 438/26, 27, 106, 113, 127
See application file for complete search history.

(56) References Cited

U.S. PATENT DOCUMENTS 8,723,192 B2   5/2014   Weidner et al.
8,742,448 B2   6/2014   Ramchen et al.
(Continued)

FOREIGN PATENT DOCUMENTS

DE        10245946 C1    10/2003
DE    102005041064 A1     3/2007
(Continued)

*Primary Examiner* — S V Clark
(74) *Attorney, Agent, or Firm* — Slater & Matsil, L.L.P.

(57) ABSTRACT

Optoelectronic semiconductor devices and methods for producing optoelectronic semiconductor devices are disclosed. In an embodiment the method includes applying a plurality of arrangements of electrically conductive first and second contact elements on an auxiliary carrier, applying an optoelectronic semiconductor chip on the second contact element of each arrangement and electrically conductively connecting the optoelectronic semiconductor chip to the first contact element for each arrangement. The method further includes encapsulating the first contact elements and the second contact elements with an encapsulation material to form an encapsulation body and singulating the encapsulation body into a plurality of optoelectronic semiconductor devices, wherein the encapsulation material finishes flush with an underside, facing the auxiliary carrier, of each first contact element, and wherein the encapsulation material finishes flush with an underside, facing the auxiliary carrier, of each second contact element.

12 Claims, 6 Drawing Sheets

(51) Int. Cl.
  *H01L 33/00* (2010.01)
  *H01L 33/48* (2010.01)
  *H01L 23/00* (2006.01)
  *H01L 31/0203* (2014.01)
  *H01L 21/78* (2006.01)
  *H01L 33/62* (2010.01)
  *H01L 23/31* (2006.01)
  *H01L 23/495* (2006.01)

(52) U.S. Cl.
  CPC .......... *H01L 24/97* (2013.01); *H01L 31/0203* (2013.01); *H01L 33/0095* (2013.01); *H01L 33/486* (2013.01); *H01L 21/561* (2013.01); *H01L 23/3107* (2013.01); *H01L 23/49541* (2013.01); *H01L 23/49548* (2013.01); *H01L 24/48* (2013.01); *H01L 24/85* (2013.01); *H01L 33/62* (2013.01); *H01L 2224/48091* (2013.01); *H01L 2224/48247* (2013.01); *H01L 2224/48465* (2013.01); *H01L 2224/85001* (2013.01); *H01L 2924/00014* (2013.01); *H01L 2924/12041* (2013.01); *H01L 2924/12042* (2013.01); *H01L 2924/12043* (2013.01); *H01L 2924/181* (2013.01); *H01L 2924/18301* (2013.01); *H01L 2933/005* (2013.01); *H01L 2933/0041* (2013.01); *H01L 2933/0066* (2013.01)

(56) References Cited

U.S. PATENT DOCUMENTS 8,975,100 B2    3/2015  Fujitomo et al.
2005/0045903 A1  3/2005  Abe et al.
2008/0290359 A1  11/2008  Inoue et al.
2009/0212316 A1  8/2009  Braune et al.
2011/0074000 A1  3/2011  Jaeger et al.
2012/0037929 A1  2/2012  Ramchen et al.
2013/0126935 A1  5/2013  Zitzlsperger et al.
2013/0140598 A1  6/2013  Höppel et al.
2013/0240935 A1  9/2013  Jäger et al.
2013/0256711 A1* 10/2013  Joo ............... H01L 33/486
                                                257/88
2014/0042488 A1  2/2014  Fujitomo et al.
2014/0225147 A1* 8/2014  Halbritter ........ H01L 33/58
                                                257/98

FOREIGN PATENT DOCUMENTS

| DE | 102008024704 A1 | 10/2009 |
| DE | 102009015963 A1 | 10/2010 |
| DE | 102009036621 A1 | 2/2011 |
| DE | 102010023815 A1 | 12/2011 |
| EP | 2161765 A2 | 3/2010 |
| JP | 2002043625 A | 2/2002 |
| JP | 2007165688 A | 6/2007 |
| JP | 2009506556 A | 2/2009 |
| JP | 2010239105 A | 10/2010 |
| JP | 2011181655 A | 9/2011 |
| JP | 2012523108 A | 9/2012 |
| WO | 2007025515 A1 | 3/2007 |
| WO | 2011157523 A1 | 12/2011 |
| WO | 2012000943 A1 | 1/2012 |

* cited by examiner

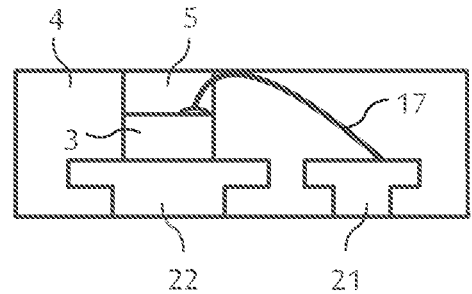
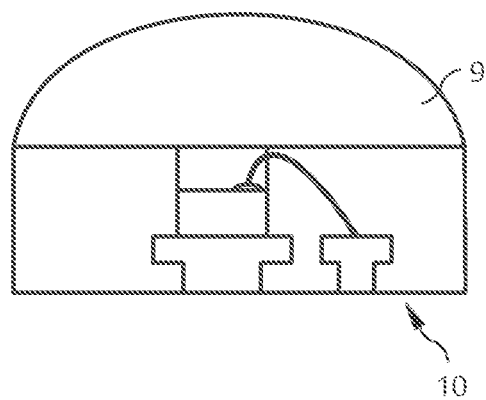
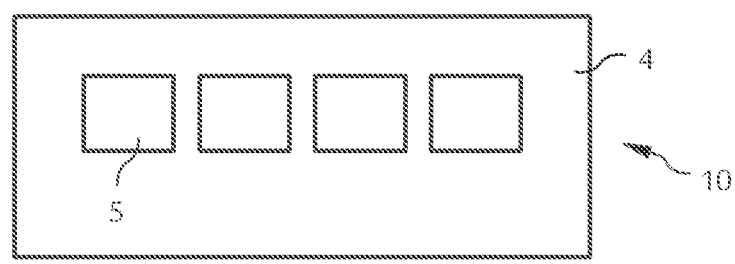
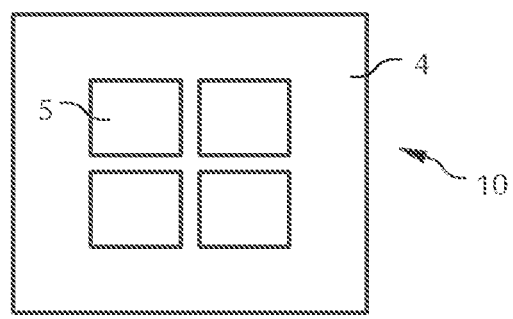

METHOD FOR PRODUCING A MULTIPLICITY OF OPTOELECTRONIC SEMICONDUCTOR COMPONENTS

This patent application is a national phase filing under section 371 of PCT/EP2013/071428, filed Oct. 14, 2013, which claims the priority of German patent application 10 2012 109 905.7, filed Oct. 17, 2012, each of which is incorporated herein by reference in its entirety.

TECHNICAL FIELD

A method for producing a multiplicity of optoelectronic semiconductor devices is provided.

BACKGROUND

International Application Publication No. WO 2007/025515 A1 describes a method for producing a multiplicity of optoelectronic semiconductor devices.

SUMMARY OF THE INVENTION

Embodiments of the invention provide a method for producing a multiplicity of optoelectronic semiconductor devices that can be mounted particularly easily at a destination. Further embodiments of the invention provide a method by which a multiplicity of optoelectronic semiconductor devices can be produced particularly easily.

The optoelectronic semiconductor devices produced by means of the method are in particular surface-mountable devices. The devices are in this case designed as so-called QFN devices (Quad Flat No Leads Package). For these devices, all of the electrical and/or thermal connection points are located on an underside of the device. The side faces of the devices, which, for example, run transversely in relation to the underside and confine the devices respectively in lateral directions, are free from the material of the connection points and, for example, are formed exclusively by an electrically insulating material.

According to at least one embodiment of a method described here, first an auxiliary carrier is provided. The auxiliary carrier may be a film or a self-supporting rigid plate. The auxiliary carrier may, for example, be formed by a metal or a plastic. The auxiliary carrier is intended for carrying a multiplicity of optoelectronic semiconductor chips during the production of the optoelectronic semiconductor devices.

According to at least one embodiment of the method, a multiplicity of arrangements of electrically conductive first contact elements and second contact elements are applied on the auxiliary carrier. For example, pairs of first electrically conductive and second electrically conductive contact elements are applied. The contact elements in each case serve on their underside, facing the auxiliary carrier, for electrically contacting components of the optoelectronic semiconductor devices in completed optoelectronic semiconductor devices. The first and second contact elements are formed here in each case by an electrically conductive material, for example, by at least one metal.

According to at least one embodiment of the method, an optoelectronic semiconductor chip is in each case applied on the second contact element of each arrangement of the multiplicity of arrangements of electrically conductive first contact elements and second contact elements. That is to say that the second contact elements in particular serve, for example, on their upper side, facing away from the auxiliary carrier, for receiving at least one optoelectronic semiconductor chip, for example, in each case a single chip. The optoelectronic semiconductor chip may be attached to the second contact elements, for example, in each case by soldering or adhesive bonding.

An optoelectronic semiconductor chip that is used for the optoelectronic semiconductor device may be, for example, a light-emitting diode chip or a photodiode chip. Furthermore, it is possible that, in the production of the multiplicity of optoelectronic semiconductor devices, both light-emitting diode chips and photodiode chips are arranged on the second contact elements.

According to at least one embodiment of the method, in a next method step, an electrically conductive connection of the optoelectronic semiconductor chips to the first contact elements of the arrangement takes place. If the arrangements are, for example, pairs of first and second contact elements, an electrically conductive connection between the optoelectronic semiconductor chip and the first contact element can take place by means of a contact wire. The first contact elements are then suitable for being connected in an electrically conductive manner to a contact wire.

According to at least one embodiment of the method described here, in a further method step, an encapsulation of the first contact elements and the second contact elements with an encapsulation material takes place. It is also possible that the encapsulation material encapsulates not only the first and second contact elements, but also, for example, at least partially the optoelectronic semiconductor chips. Encapsulated components of the multiplicity of optoelectronic semiconductor devices are in particular in direct contact with the encapsulation material and directly adjoin said material.

The encapsulation may take place, for example, by injection molding or transfer molding. The encapsulation material may be, for example, a silicone, an epoxy resin, a hybrid material of silicone and epoxy resin or some other plastics material. It is also possible that the encapsulation material contains one or more of these materials, while further fillers, such as, for example, reflective particles, may be additionally present in the encapsulation material.

According to at least one embodiment of the method, singulation into a multiplicity of optoelectronic semiconductor devices takes place. The singulation takes place in this case in such a way that each optoelectronic semiconductor device contains at least one of the optoelectronic semiconductor chips. For example, each optoelectronic semiconductor device contains precisely one optoelectronic semiconductor chip and precisely one arrangement of electrically conductive first and second contact elements. The singulation may take place, for example, by sawing, grinding or laser cutting. In the singulation, the encapsulation material is also cut through, at least in certain places.

According to at least one embodiment of the method, the encapsulation material finishes flush with the underside, facing the auxiliary carrier, of each first contact element and of each second contact element. That is to say that, on the completed semiconductor devices, the undersides of the contact elements are in each case exposed, wherein the contact elements finish flush with the encapsulation material, so that it is possible in particular that the contact elements are not arranged in a depression in the encapsulation material and that the contact elements do not protrude beyond the encapsulation material.

According to at least one embodiment of the method, the method comprises the following production steps: providing an auxiliary carrier, applying a multiplicity of arrangements of electrically conductive first contact elements and second contact elements onto the auxiliary carrier, applying in each case an optoelectronic semiconductor chip on the second contact element of each arrangement, electrically conductively connecting the optoelectronic semiconductor chips to the first contact elements of the respective arrangement, encapsulating the first contact elements and the second contact elements with an encapsulation material, and singulating into a multiplicity of optoelectronic semiconductor devices, wherein the encapsulation material finishes flush with the underside, facing the auxiliary carrier, of each first contact element, and wherein the encapsulation material finishes flush with the underside, facing the auxiliary carrier, of each second contact element.

The production steps may in this case be carried out in the sequence specified here. However, it is also possible to deviate from the sequence specified.

On account of the fact that the encapsulation material finishes flush with the first and second contact elements, the optoelectronic semiconductor devices can be produced particularly easily by the method. The method can therefore be carried out at particularly low cost.

Furthermore, on account of the production method, no metal areas occur on the side faces of the optoelectronic semiconductor devices produced by the method, which makes the mounting of the optoelectronic semiconductor devices easier.

Since the first and second contact elements of each of the optoelectronic semiconductor devices produced by the method finish on the underside flush with the encapsulation material, they are exposed over their entire electrical connection area on the underside of the optoelectronic semiconductor device. This makes possible optoelectronic semiconductor devices that have a particularly low thermal resistance between the optoelectronic semiconductor chip, which generates heat during operation, and the mounting area, at which the optoelectronic semiconductor devices are attached, on account of the contact elements. As a result, optoelectronic semiconductor devices with increased efficiency, and consequently greater fail safety, are obtained.

On account of the fact that the individual contact elements are encapsulated by an encapsulation material, which is in particular formed in an electrically insulating manner, the risk of short-circuiting between individual contact elements is reduced. As a result, a greater fail safety of the optoelectronic semiconductor devices produced by the method is likewise obtained.

Before the singulation, there is no electrically conductive connection between the arrangements of contact elements. Consequently, a functional test can be carried out before the singulation for each optoelectronic semiconductor chip independently of the other optoelectronic semiconductor chips.

Furthermore, a method described here allows particularly small optoelectronic semiconductor devices to be produced, of outer dimensions that are determined primarily by the size of the optoelectronic semiconductor chips that are used.

According to at least one embodiment of the method, all of the side faces of the singulated optoelectronic semiconductor devices are free from the electrically conductive first contact elements and the second contact elements. That is to say that the contact elements are completely enclosed by the encapsulation material on an underside of the completed optoelectronic semiconductor devices. On the side faces of the singulated optoelectronic semiconductor devices, the encapsulation material is, for example, exposed. Material of the first and second contact elements is not bared at the side faces. The side faces of the singulated optoelectronic semiconductor devices in this case have traces of singulation, such as, for example, sawing grooves, on the side faces.

According to at least one embodiment of the method, the encapsulation material covers side faces of each optoelectronic semiconductor chip, at least in certain places. That is to say that, apart from the first and second contact elements, the optoelectronic semiconductor chips are also at least partly surrounded by the encapsulation material. In this case it is possible that the encapsulation material completely surrounds the optoelectronic semiconductor chips. It is also possible that the encapsulation material does not protrude beyond the optoelectronic semiconductor chips on their upper side, facing away from the second contact elements. The optoelectronic semiconductor chips may then finish at their upper side in each case flush with the encapsulation material or protrude beyond the encapsulation material.

According to at least one embodiment of the method, the auxiliary carrier is formed by a metal and the first contact elements and the second contact elements have been grown on the auxiliary carrier. The auxiliary carrier may, for example, be a solid metal carrier, which may be formed by materials such as copper or nickel. For example, a mask may be defined by means of a photo technique on an upper side of the auxiliary carrier, on which the contact elements are subsequently arranged. The first and second contact elements may be produced in the openings in the mask, for example, by galvanic or currentless deposition. In this way it is possible to produce low-cost contact elements in a defined form at a defined place in a particularly easy way.

According to at least one embodiment, the first contact elements and the second contact elements in each case have undercuts. That is to say that the contact elements have, for example, a thinner region, which directly follows the auxiliary carrier, and a region with greater lateral extent, which is arranged on the side of the contact elements that is facing away from the auxiliary carrier. The lateral directions are in this case those directions that run parallel to a plane of main extent of the auxiliary carrier. The first and second contact elements consequently have, for example, in cross section the form of a T or the form of a mushroom.

The undercuts of the contact elements may in this case serve for better anchoring of the contact elements in the encapsulation material.

During the growing on of the contact elements, the contact elements with undercuts may be produced by suitable control of the process parameters, for example, of galvanic deposition. It is also possible that the undercuts are produced by etching. The contact elements may then be in particular half-etched leadframes. In this case it is possible in particular that, instead of a metal carrier, a carrier of lower cost, for example, of a plastics material, may be used as the auxiliary carrier.

According to at least one embodiment of the method, the encapsulation material is embodied in a reflective manner and at least the upper side, facing away from the second contact elements, of each optoelectronic semiconductor chip is free from the encapsulation material. The encapsulation material may in this case be formed in particular as reflective to the electromagnetic radiation that is produced or to be detected in the optoelectronic semiconductor chips during operation. For example, the optoelectronic semiconductor chips are semiconductor chips that produce electromagnetic radiation, in particular light, during operation. The reflectively formed encapsulation with the reflectively formed encapsulation material then has a reflectivity of at least 80%, in particular of at least 90%, to the electromagnetic radiation of the optoelectronic semiconductor chip that is incident on it.

For this purpose, the encapsulation material may comprise a matrix material, such as, for example, silicone and/or epoxy resin, which is filled with particles of a filler.

The filler may, for example, consist at least of one of the materials $TiO_2$, $BaSO_4$, ZnO, $Al_xO_y$, $ZrO_2$ or contain one of said materials.

In this case it is possible in particular that the encapsulation material is reflective in such way that it appears white to the viewer. In particular, the encapsulation material no longer has transparency, but reflects incident ambient light uniformly, so that the impression of a white color is created.

According to at least one embodiment of the method, a multiplicity of separating frames are attached on the auxiliary carrier before the encapsulation with encapsulation material. The separating frames are, for example, formed by a plastics material.

In this case the separating frames enclose in the lateral direction at least one arrangement of electrically conductive first contact elements and second contact elements. The separating frames are in this case arranged in such a way that they are arranged between individual optoelectronic semiconductor devices, such as are intended to be produced after the singulation. In this way it is possible that the side faces of the singulated optoelectronic semiconductor devices are formed in certain places by parts of the separating frames. Plastics materials that are particularly hard or scratch-resistant in relation to the encapsulation materials mentioned may be used, for example, for the separating frames. Singulation then takes place through the separating frames, so that the side faces of the singulated optoelectronic semiconductor devices are formed in certain places by parts of the separating frames. In this way it is possible to fabricate optoelectronic semiconductor devices that are mechanically particularly stable.

According to at least one embodiment of the method, after the encapsulation with the encapsulation material, a converter material is applied on the upper side, facing away from the auxiliary carrier, of the optoelectronic semiconductor chips and/or on the upper side, facing away from the auxiliary carrier, of the encapsulation material. The converter material comprises, for example, at least one phosphor, which absorbs electromagnetic radiation emitted by the semiconductor chip during operation and re-emits electromagnetic radiation, in particular from a greater wavelength range than the radiation emitted by the semiconductor chip. The optoelectronic semiconductor device produced by the method may then, for example, be suitable for producing mixed radiation, for example, white mixed light, during operation. The converter material may comprise a matrix material, which is, for example, the same matrix material that also forms part of the encapsulation material. Particles of a phosphor may be incorporated in the matrix material. It is also possible that the converter material consists of a phosphor, in which case the converter material may then, for example, consist of a ceramic phosphor.

According to at least one embodiment of the method, the encapsulation material and/or the converter material cover(s) the separating frames on their upper side, facing away from the auxiliary carrier. That is to say that, on the upper side of the optoelectronic semiconductor devices produced by the method, the separating frames are covered by the encapsulation material or by the converter material. In this way, the separating frames are anchored particularly well in the encapsulation material and/or converter material and do not become detached from the optoelectronic semiconductor devices produced by means of the method.

According to at least one embodiment of the method, recesses, which extend from an upper side, facing away from the encapsulation material, of the converter material up to the encapsulation material or into the encapsulation material, are introduced into the converter material in certain places and the recesses are filled with encapsulation material. The encapsulation material is in this case, for example, a reflective encapsulation material, as described further above. The recesses may be trenches that are confined in lateral directions by the converter material. It is also possible that the recesses are formed in regions in which singulation into a multiplicity of optoelectronic semiconductor devices takes place. After the singulation, which then takes place through the encapsulation material in the recesses, the side faces of the optoelectronic semiconductor devices produced in this way are formed at least in certain places by the encapsulation material that has been filled into the recesses. This encapsulation material is then not completely surrounded by converter material in the lateral directions, but, for example, only on its side of the encapsulation material in the recess that is facing the at least one semiconductor chip of the semiconductor device.

BRIEF DESCRIPTION OF THE DRAWINGS

The method described here is explained in more detail below on the basis of exemplary embodiments and the associated figures.

On the basis of FIGS. 1A to 1I, an exemplary embodiment of a method described here is explained in more detail by means of schematic sectional representations.

Figure 2A:
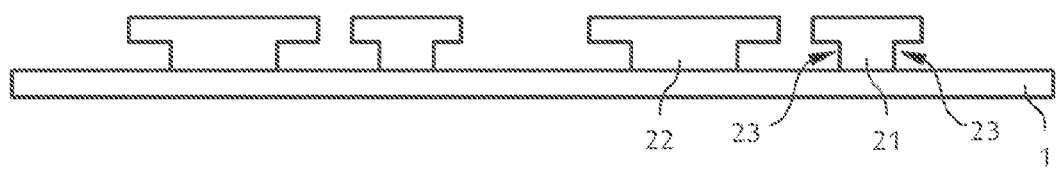
Figure 2B:
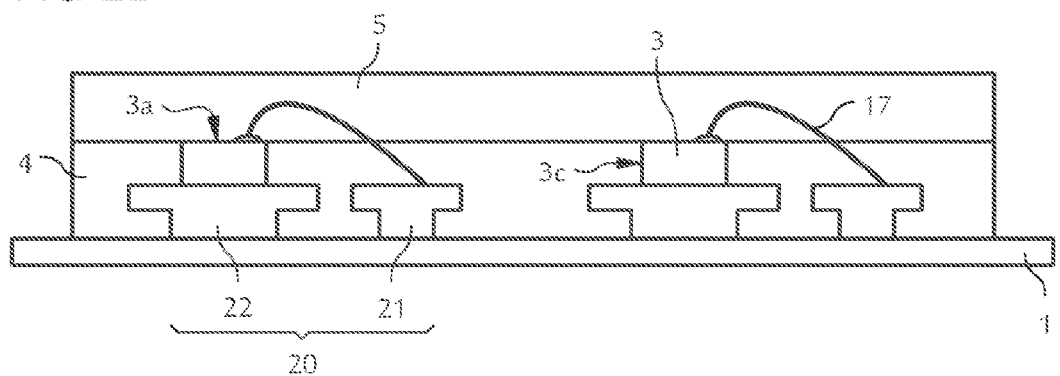
Figure 2C:
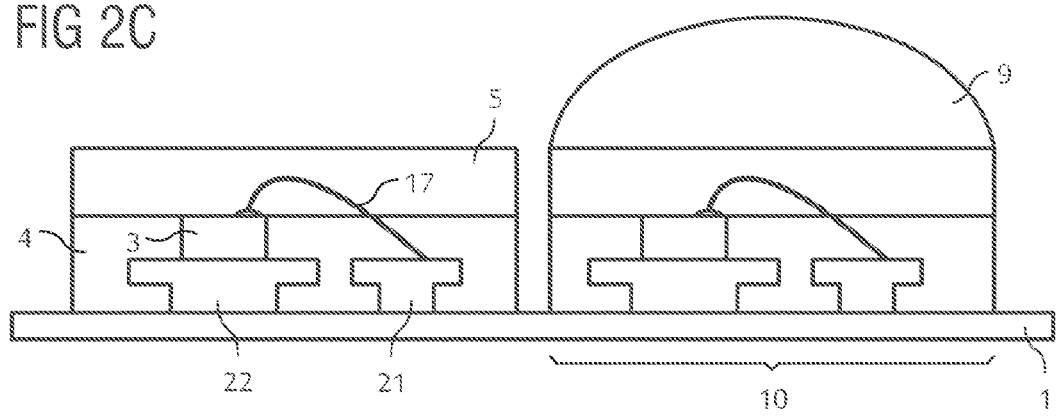

On the basis of FIGS. 2A to 2C, a further exemplary embodiment of a method described here is explained by means of schematic sectional representations.

Figure 3A:
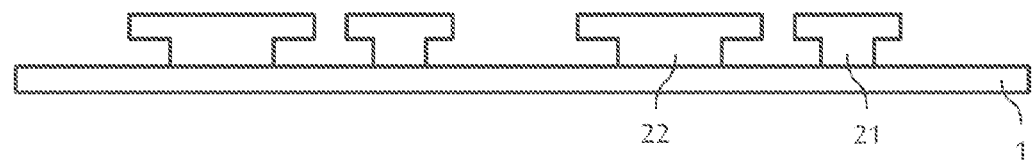
Figure 3B:
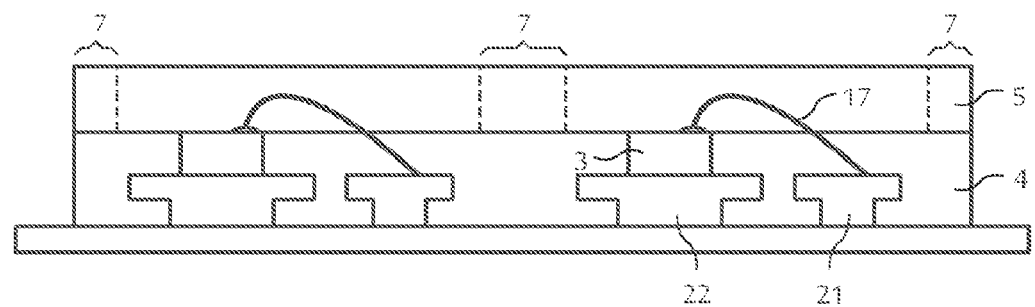
Figure 3C:
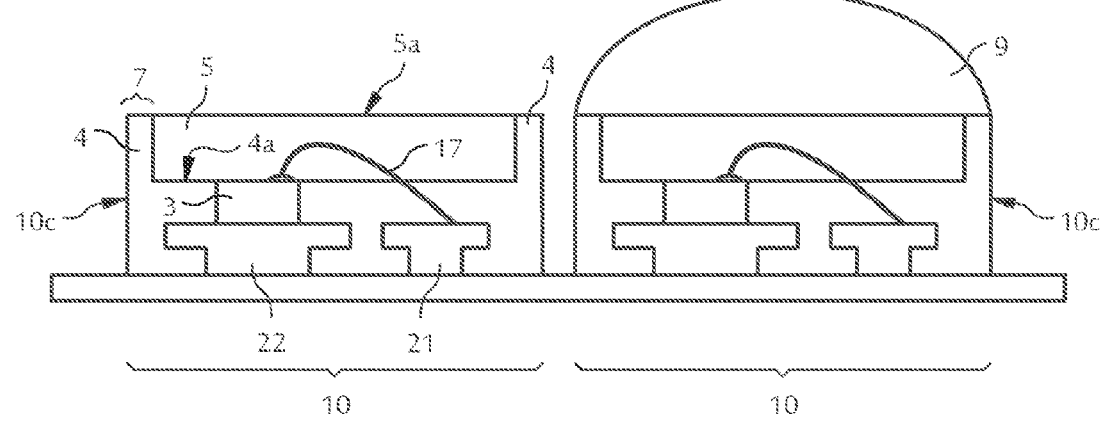
Figure 7A:
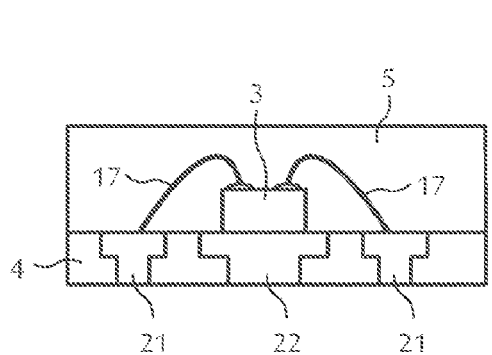
Figure 7B:
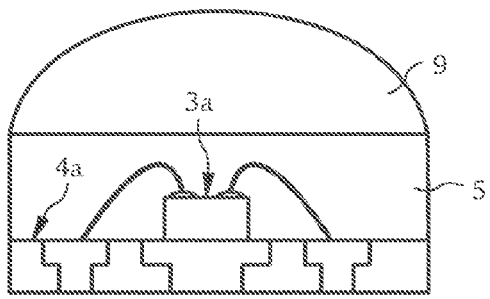
Figure 7C:
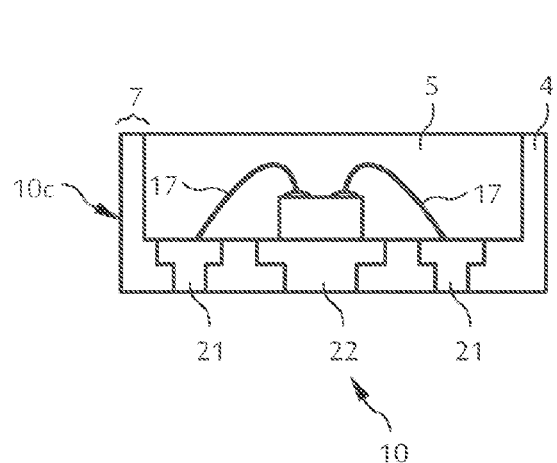
Figure 7D:
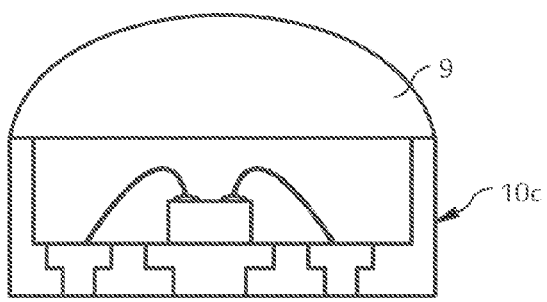

On the basis of FIGS. 3A to 3C, a further exemplary embodiment of a method described here is explained in more detail by means of schematic sectional representations.

FIGS. 4A, 4B, 5, 6, 7A, 7B, 7C and 7D show examples of optoelectronic semiconductor devices that have been produced by a method described here.

Elements that are the same, of the same type or act in the same way are provided with the same designation signs in the figures. The figures and the relative sizes of the elements represented in the figures with respect to one another are not to be considered as true to scale. Rather, individual elements may be shown exaggerated in size for the sake of better representation and/or better understanding.

DETAILED DESCRIPTION OF ILLUSTRATIVE EMBODIMENTS

In FIGS. 1A to 1I, method steps of a method described here for producing a multiplicity of optoelectronic semiconductor devices are explained by means of schematic sectional representations.

Figure 1A:

FIG. 1A shows how an auxiliary carrier 1 is provided. The auxiliary carrier 1 may be, for example, a solid metal carrier, which, for example, consists of copper or nickel.

Figure 1B:
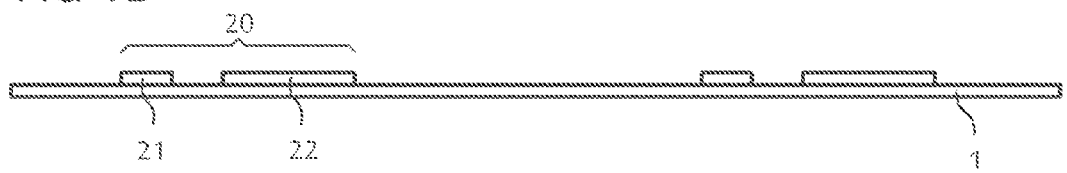

In a next method step, FIG. 1B, regions in which a multiplicity of arrangements of electrically conductive first contact elements 21 and second contact elements 22 are applied on the auxiliary carrier 1 are defined on the metal carrier by means of a mask that is not represented. At least the contact elements 21 are in this case electrically conductive, preferably in the present exemplary embodiment the second contact elements 22 are also electrically conductive. In the method step described in connection with FIG. 1B, the arrangements 20 of first contact elements and second contact elements are formed as pairs of these contact elements. The growing on of the contact elements takes place, for example, currentlessly or galvanically.

Figure 1C:
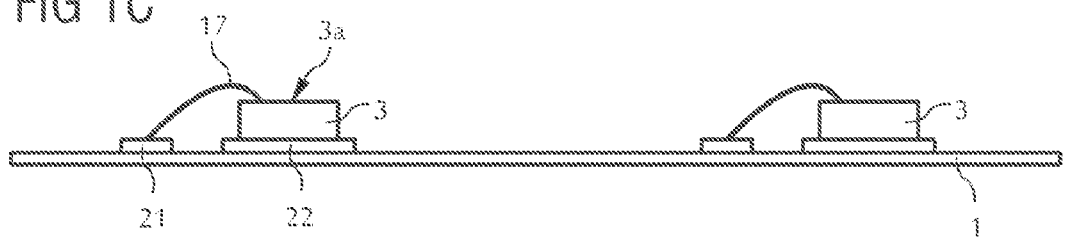

In a next method step, FIG. 1C, an optoelectronic semiconductor chip 3 is in each case applied on every second contact element 22 of each arrangement 20. For example, the optoelectronic semiconductor chip 3 may in each case be soldered on or adhesively attached in an electrically conductive manner by its underside, facing away from the upper side 3a, onto the second contact element 22.

This is followed by electrically conductively connecting the optoelectronic semiconductor chips 3 to the first contact elements 21 of the assigned arrangement 20. Each arrangement 20 then comprises an optoelectronic semiconductor chip that is, for example, connected in an electrically conductive manner to the first contact elements 21 and the second contact elements 22. In the present case, the electrical contacting takes place in each case by way of a contact wire 17, which provides an electrically conductive connection between the first contact elements 21 and the optoelectronic semiconductor chip 3 of the respective arrangement 20, compare in this respect FIG. 1C.

Figure 1D:
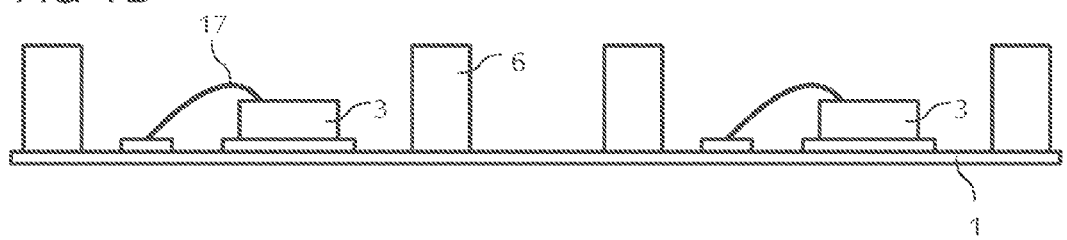

In a next method step, FIG. 1D, separating frames 6 are attached on the auxiliary carrier 1. Each separating frame 6 in this case encloses at least one arrangement of electrically conductive first contact elements 21 and second contact elements 22 at least in certain places laterally, that is to say in lateral directions. For example, it is possible that each arrangement 20 is completely enclosed in the lateral directions by precisely one separating frame 6. The application of the separating frames, as shown in FIG. 1D, is optional here. The separating frames 6 may, for example, be formed by a plastics material. The separating frames 6 are, for example, radiation-absorbent or radiation-reflective.

Figure 1E:
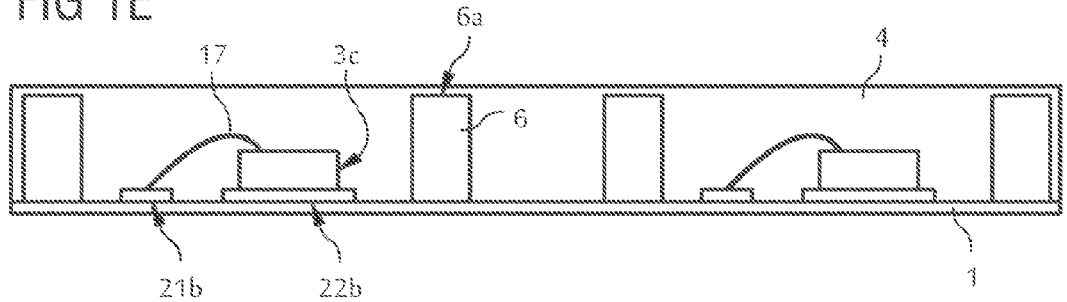

In the following method step, see FIG. 1E, an encapsulation of the first contact elements 21 and the second contact elements 22 and also in the present case of the semiconductor chips 3 and the separating frames 6 takes place with an encapsulation material 4, which in the present case is formed as transparent encapsulation material.

The encapsulation material 4 covers, for example, the side faces 3c and the upper side 3a of the optoelectronic semiconductor chips. Furthermore, the encapsulation material 4 covers the separating frames 6 on their upper side 6a, facing away from the auxiliary carrier 1.

Figure 1F:
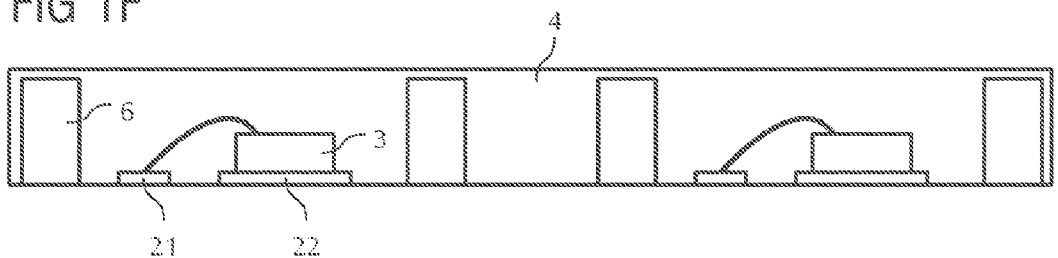

After the application of the encapsulation material 4, which also adjoins the auxiliary carrier 1 in certain places, the auxiliary carrier 1 may be removed, as shown in connection with FIG. 1F. This may take place, for example, by etching. This results in an arrangement of optoelectronic semiconductor devices in which the encapsulation material 4 finishes flush with the first contact element 21 on the underside 21b, originally facing the auxiliary carrier 1, of each first contact element 21. Furthermore, the encapsulation material 4 finishes flush with the underside 22b, facing the auxiliary carrier 1, of each second contact element 22. After the removal of the auxiliary carrier 1, the undersides 21b and 22b of the first and second contact elements are in each case exposed on the underside of the optoelectronic semiconductor devices and are completely surrounded by the encapsulation material 4 in lateral directions.

This results in an arrangement of optoelectronic semiconductor devices in which electrical connection points are only arranged on the underside, while no projection and no depression is formed in the region of the connection points, that is to say the undersides 21b and 22b of the electrical contact elements 21, 22.

Figure 1G:
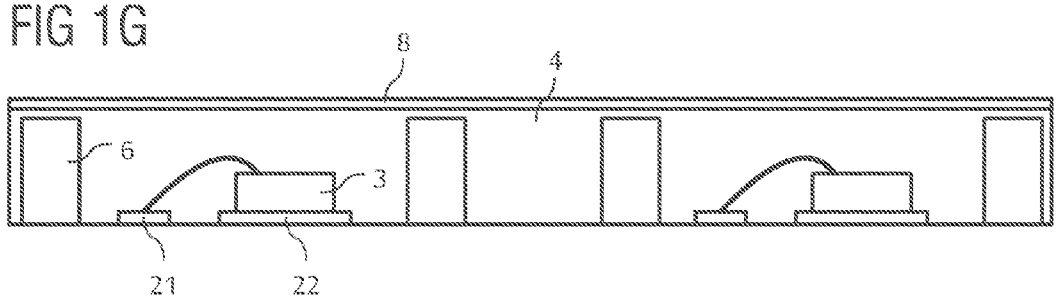

In a next method step, FIG. 1G, a carrier 8, which may, for example, be an adhesive film with an adhesive side on the upper side, directed toward the encapsulation material 4, may be applied on the encapsulation material 4, on the side originally facing away from the auxiliary carrier.

Figure 1H:
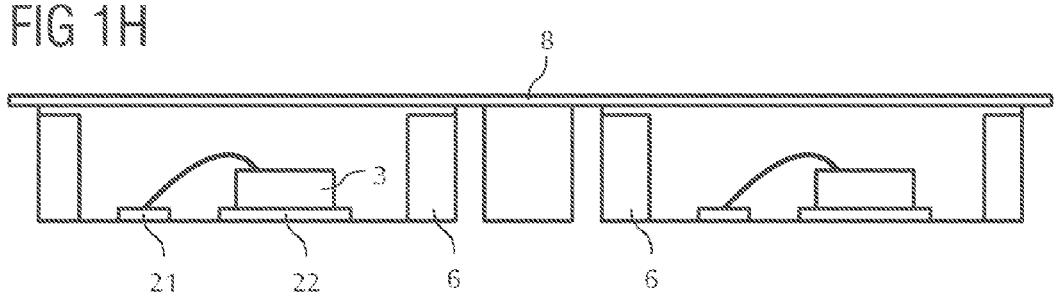
Figure 1I:
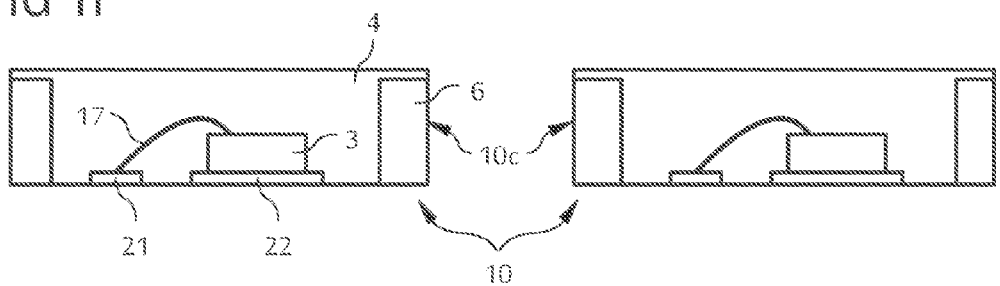

A singulation may take place in the region of the separating frames 6, see FIG. 1H, by cut-off grinding, for example.

Finally, dividing into individual optoelectronic semiconductor devices 10, on which the side faces 10c are formed at least in certain places through the separating frames 6, takes place. Each optoelectronic semiconductor device in this case comprises at least one optoelectronic semiconductor chip 3, FIG. 1I.

A further exemplary embodiment of a method described here is explained in more detail in connection with the schematic sectional representations of FIGS. 2A to 2C. As a difference from the methods described in connection with FIGS. 1A to 1I, in this exemplary embodiment the first contact elements 21 and the second contact element 22 have undercuts 23. For example, the contact elements 21, 22 are of a T-shaped form in cross section. The contact elements 21, 22 may, for example, be of a mushroom-shaped form. This configuration of the contact elements 21, 22 allows particularly good anchoring of the contact elements in the encapsulation material 4.

As described above, the contact elements 21, 22 may have been grown onto the auxiliary carrier 1. It is also possible that the contact elements 21, 22 are parts of a half-etched leadframe that is adhesively attached on the auxiliary carrier 1, which may then, for example, be formed as a plastic film. Connecting struts of the leadframe are removed, for example, by sawing.

In a next method step, FIG. 2B, a reflective encapsulation material is applied in such a way that the side faces 3c and also the contact elements 21, 22 are encapsulated by the encapsulation material 4. The optoelectronic semiconductor chips 3 have in this case been adhesively attached beforehand, for example, onto the second contact elements 22 of each arrangement 20. Contacting has also been established with respect to the first contact elements 21 of each arrangement 20 and the assigned semiconductor chip 3 by way of a contact wire 17. The encapsulation material 4 is in this case applied by dispensing or injection molding.

On the upper side 3a, facing away from the auxiliary carrier 1, of the optoelectronic semiconductor chips 3, the encapsulation material 4 may finish flush with these chips.

In a next method step, the converter material 5 is applied onto to the upper sides, facing away from the auxiliary carrier 1, of the encapsulation material 4 and also of the optoelectronic semiconductor chips 3. The converter material comprises, for example, at least one phosphor. The converter material 5 may be applied by way of injection molding, compression molding, casting or sedimentation in a potting.

An optical element 9, for example, a lens, may be arranged after the converter material 5, on the sides facing away from the auxiliary carrier 1. Before or after the application of the lens, singulation into individual optoelectronic semiconductor devices 10 may take place. This singulation takes place, for example, with the aid of a $CO_2$ laser, FIG. 2C.

Each of the optoelectronic semiconductor devices may optionally include an ESD protective element, for example, an ESD diode. The ESD diode may, for example, be connected antiparallel with the optoelectronic semiconductor chip 3, and for this purpose be attached in each case on the first contact element 21 of each arrangement 20.

A further exemplary embodiment of a method described here is explained in more detail in connection with FIGS. 3A to 3C. As a difference from the method of FIGS. 2A to 2C, in the case of this variant of the production method recesses 7 are introduced into the converter material 5, extending into the encapsulation material 4. These recesses 7 are produced before the singulation. The recesses 7 are subsequently filled with the encapsulation material 4, so that the converter material 5 of each individual optoelectronic semiconductor device 10 is surrounded by the encapsulation material 4 in lateral directions. The encapsulation material 4 may in this case be, for example, reflective and appear white. The side faces 10c of each optoelectronic semiconductor device 10 are then, for example, formed completely by the encapsulation material 4.

The optoelectronic semiconductor chip may be, for example, a light-emitting diode chip that is free from a growth substrate. For example, the optoelectronic semiconductor chip may then be a so-called thin-film chip, on which the epitaxially grown semiconductor layers are first attached on their side facing away from the growth substrate to a carrier, and then the growth substrate is removed from the epitaxially grown semiconductor layer sequences. In addition, it is possible that the optoelectronic semiconductor chip is a substrateless diode, just consisting of electrical contact elements and the epitaxially grown semiconductor layer sequence.

An optoelectronic semiconductor device 10 that has been produced by a method described here is described in connection with FIG. 4A by means of a schematic sectional representation. As a difference from the method described, for example, in connection with FIGS. 3A to 3C, an optoelectronic semiconductor device on which the converter material 5 is only arranged in the region of the semiconductor chip 3 results here. This may take place, for example, by a clearance that is subsequently filled with the converter material 5 being provided over the semiconductor chip 3 during the application of the encapsulation material 4.

As FIG. 4B shows, such an optoelectronic semiconductor device 10 too may comprise an optical element 9 such as a lens, which may, for example, be attached to the encapsulation material 4 and to the converter material 5 by adhesive bonding.

The schematic plan views of FIGS. 5 and 6 show optoelectronic semiconductor devices 10, as they are described in connection with FIGS. 4A and 4B, wherein a plurality of optoelectronic semiconductor chips 3 of the same type, in the exemplary embodiment 4, are arranged in a semiconductor device 10.

Further optoelectronic semiconductor devices that have been produced by a method described here are described in connection with FIGS. 7A, 7B, 7C, 7D and 7E by means of schematic sectional representations. In the exemplary embodiments of FIG. 7, each semiconductor device 10 comprises two first contact elements 21 and a single second contact element 22. The first contact elements 21 serve for the electrical contacting of the optoelectronic semiconductor chip 3, which is connected to the contact elements 21 in each case by way of a contact wire 17. The second contact element 22 serves only for the thermal connection of the optoelectronic semiconductor chip 3, which may, for example, also be adhesively attached to the second contact element 22 in an electrically insulating manner.

The optoelectronic semiconductor chips 3 may be so-called sapphire chips, on which the epitaxially grown semiconductor layers have been grown onto a sapphire growth substrate, which remains in the optoelectronic semiconductor chip. They may also be thin-film chips, which are contacted by two contact wires. Such optoelectronic semiconductor chips are described, for example, in International Application Publication No. WO 2011/157523 A1, which is hereby included by reference.

It is in this case possible that the encapsulation material 4 also covers the side faces 3c of the optoelectronic semiconductor chips 3, as is shown, for example, in connection with FIG. 4A, 4B, 3C or 2C. Alternatively, it is possible, as represented in FIGS. 7A to 7D, that the encapsulation material 4 is only present in the region of the contact elements 21, 22, compare FIGS. 7A and 7B, or additionally on the side faces 10c in the region of recesses 7.

In these cases, the optoelectronic semiconductor chips 3 are also completely surrounded by the converter material 5 on the side faces 3c. This proves to be particularly advantageous if an appreciable proportion of the electromagnetic radiation that is produced by the optoelectronic semiconductor chips 3 leaves the optoelectronic semiconductor chips 3 through the side faces 3c. This is the case, for example, for sapphire chips.

The invention is not restricted by the description on the basis of the exemplary embodiments to these embodiments. Rather, the invention comprises every novel feature and every combination of features, which includes in particular any combination of features in the patent claims, even if this feature or this combination itself is not explicitly specified in the patent claims or exemplary embodiments.

The invention claimed is:

1. A method for producing a plurality of optoelectronic semiconductor devices, the method comprising:
   applying a plurality of arrangements of electrically conductive first and second contact elements on an auxiliary carrier;
   applying an optoelectronic semiconductor chip on the second contact element of each arrangement;
   electrically conductively connecting the optoelectronic semiconductor chip to the first contact element for each arrangement;
   encapsulating the first contact elements and the second contact elements with an encapsulation material to form an encapsulation body; and
   singulating the encapsulation body into a plurality of optoelectronic semiconductor devices,
   wherein the encapsulation material finishes flush with an underside, facing the auxiliary carrier, of each first contact element, and
   wherein the encapsulation material finishes flush with an underside, facing the auxiliary carrier, of each second contact element.

2. The method according to claim 1, wherein all side faces of the singulated optoelectronic semiconductor devices are free from the first contact elements and second contact elements.

3. The method according to claim 1, wherein a plurality of separating frames are attached on the auxiliary carrier before encapsulating the first contact elements and the second contact elements, wherein each separating frame encloses at least one arrangement of the first contact elements and the second contact elements at least in certain places laterally, and wherein side faces of the singulated optoelectronic semiconductor devices comprises certain places by parts of the separating frames.

4. The method according to claim 1, wherein the encapsulation material covers side faces of each optoelectronic semiconductor chip, at least in certain places.

5. The method according to claim 1, wherein the auxiliary carrier comprises a metal and the first contact elements and the second contact elements are grown on the auxiliary carrier.

6. The method according to claim 1, wherein the first contact elements and the second contact elements have undercuts.

7. The method according to claim 1, wherein the encapsulation material is reflective, and wherein at least an upper side, facing away from the second contact elements, of each optoelectronic semiconductor chip is free from the encapsulation material.

8. The method according to claim 1, wherein the encapsulation material is configured to appear white.

9. The method according to claim 1, further comprising, after encapsulating the first contact elements and the second contact elements, applying a converter material on upper sides, facing away from the auxiliary carrier, of the optoelectronic semiconductor chips or on an upper side, facing away from the auxiliary carrier, of the encapsulation material.

10. The method according to claim 1, wherein the encapsulation material or a converter material cover(s) separating frames on upper sides, facing away from the auxiliary carrier.

11. The method according to claim 1, further introducing recesses into a converter material in certain places, the recesses extend from an upper side, facing away from the encapsulation material, of the converter material to the encapsulation material or into the encapsulation material, and filling the recesses with encapsulation material.

12. A method for producing a plurality of optoelectronic semiconductor devices, the method comprising:
   applying a plurality of arrangements of electrically conductive first and second contact elements on an auxiliary carrier;
   applying an optoelectronic semiconductor chip on the second contact element of each arrangement;
   electrically conductively connecting the optoelectronic semiconductor chip to the first contact element for each arrangement;
   encapsulating the first contact elements and the second contact elements with an encapsulation material to form an encapsulation body; and
   singulating the encapsulation body into the plurality of optoelectronic semiconductor devices,
   wherein the encapsulation material finishes flush with an underside, facing the auxiliary carrier, of each first contact element,
   wherein the encapsulation material finishes flush with an underside, facing the auxiliary carrier, of each second contact element,
   wherein a plurality of separating frames are attached to the auxiliary carrier before encapsulating the first contact elements and the second contact elements,
   wherein each separating frame encloses at least one arrangement of the first contact elements and the second contact elements at least in certain places laterally,
   wherein side faces of the singulated optoelectronic semiconductor devices comprise in certain places parts of the separating frames,
   wherein the encapsulation material or a converter material cover(s) the separating frames on upper sides, facing away from the auxiliary carrier, and
   wherein the first contact elements and the second contact elements are completely enclosed by the encapsulation material on an underside of the singulated optoelectronic semiconductor devices.

* * * * *

UNITED STATES PATENT AND TRADEMARK OFFICE
CERTIFICATE OF CORRECTION

PATENT NO. : 9,318,357 B2  
APPLICATION NO. : 14/436578  
DATED : April 19, 2016  
INVENTOR(S) : Martin Brandl Page 1 of 1

It is certified that error appears in the above-identified patent and that said Letters Patent is hereby corrected as shown below:

On the Title Page, Item (71) Applicant, line 1, delete "OSRAM Opto Semiconductor GmbH," and insert --OSRAM Opto Semiconductors GmbH,--.

Signed and Sealed this  
Thirty-first Day of May, 2016

Michelle K. Lee  
*Director of the United States Patent and Trademark Office*